(12) United States Patent
Her et al.

(10) Patent No.: US 11,169,741 B2
(45) Date of Patent: Nov. 9, 2021

(54) STORAGE DEVICE AND METHOD OF OPERATING THE SAME

(71) Applicant: SK hynix Inc., Icheon-si Gyeonggi-do (KR)

(72) Inventors: Min Ho Her, Cheongju-si Chungcheongbuk-do (KR); Sung Ho Kim, Cheongju-si Chungcheongbuk-do (KR); Seung Il Kim, Cheongju-si Chungcheongbuk-do (KR); Jae Min Lee, Cheongju-si Chungcheongbuk-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/784,117

(22) Filed: Feb. 6, 2020

(65) Prior Publication Data
US 2021/0026565 A1 Jan. 28, 2021

(30) Foreign Application Priority Data
Jul. 26, 2019 (KR) ................... 10-2019-0091225

(51) Int. Cl.
*G06F 3/00* (2006.01)
*G06F 3/06* (2006.01)
*G11C 15/04* (2006.01)
*G11C 16/04* (2006.01)

(52) U.S. Cl.
CPC .......... *G06F 3/0659* (2013.01); *G06F 3/0604* (2013.01); *G06F 3/0673* (2013.01); *G11C 15/046* (2013.01); *G11C 16/0483* (2013.01)

(58) Field of Classification Search
CPC ... G11C 15/046; G11C 16/0483; G11C 16/20; G11C 7/1042; G11C 7/1045; G11C 7/109; G11C 7/20; G11C 16/26; G11C 7/1006; G11C 7/1015; G11C 8/12; G06F 3/0604; G06F 3/0659; G06F 3/0673; G06F 3/0614; G06F 3/0658; G06F 9/30101; G06F 9/3013
See application file for complete search history.

(56) References Cited

U.S. PATENT DOCUMENTS

2014/0104967 A1* 4/2014 Arai ................... G06F 13/28
365/189.17

FOREIGN PATENT DOCUMENTS

| KR | 1020160119140 A | 10/2016 |
|---|---|---|
| KR | 1020180127175 A | 11/2018 |

* cited by examiner

*Primary Examiner* — Thong Q Le
(74) *Attorney, Agent, or Firm* — William Park & Associates Ltd.

(57) ABSTRACT

The present technology relates to a storage device and a method of operating the same. The storage device includes a memory controller configured to generate and output a get parameter command set, including normal addresses and a dummy address, during a parameter read operation, and a memory device configured to, in response to the get parameter command set, read parameter data that is stored in a CAM block and store the read parameter data in target registers corresponding to the normal addresses. The memory device stores dummy data in a dummy register corresponding to the dummy address.

19 Claims, 12 Drawing Sheets

REGISTER COMPONENT

| ADDRESS | STORAGE DATA |
|---|---|
| Add1 | Para_1 |
| Add2 | Para_2 |
| Add3 | Para_3 |
| Dummy Add | Dummy Data |

STORAGE DEVICE AND METHOD OF OPERATING THE SAME

CROSS-REFERENCE TO RELATED APPLICATION

The present application claims priority under 35 U.S.C. § 119(a) to Korean patent application number 10-2019-0091225, filed on Jul. 26, 2019, in the Korean Intellectual Property Office, the entire disclosure of which is incorporated herein by reference.

BACKGROUND

1. Technical Field

The present disclosure relates to an electronic device, and more particularly, to a storage device and a method of operating the same.

2. Related Art

A storage device is a device that stores data based on commands from a host device, such as a computer or a smartphone. A storage device may include a memory device to store data and a memory controller to control the memory device. The memory device is divided into a volatile memory device and a non-volatile memory device.

A volatile memory device is a device that stores data only when power is supplied and loses the stored data when the power supply is cut off. For example, a volatile memory device may be a static random access memory (SRAM), a dynamic random access memory (DRAM), and the like.

A non-volatile memory device is a device that does not lose data even when power is cut off. For example, a non-volatile memory device may be a read only memory (ROM), a programmable ROM (PROM), an electrically programmable ROM (EPROM), an electrically erasable and programmable ROM (EEPROM), a flash memory, and the like.

SUMMARY

A storage device according to an embodiment of the present disclosure includes a memory controller configured to generate and output a get parameter command set, including normal addresses and a dummy address, during a parameter read operation, and a memory device configured to, in response to the get parameter command set, read parameter data that is stored in a CAM block and store the read parameter data in target registers corresponding to the normal addresses. The memory device stores dummy data in a dummy register corresponding to the dummy address.

A storage device according to an embodiment of the present disclosure includes a memory controller configured to generate and output a set parameter command set, including normal addresses and a dummy address, during a parameter conversion operation, and a memory device configured to, in response to the set parameter command set, store new parameter data in a plurality of target registers corresponding to the normal addresses, in which previous parameter data are stored. The memory device stores dummy data in a dummy register corresponding to the dummy address.

A method of operating a storage device according to an embodiment of the present disclosure includes storing parameter data within a CAM block of a memory device within the storage device generating and transmitting a get parameter command set, including a normal address and a dummy address, to the memory device, reading the parameter data, stored in the CAM block, in response to the get parameter command set, and storing the read parameter data in target registers, among a plurality of registers, corresponding to the normal address, and storing dummy data in a dummy register, among the plurality of registers, corresponding to the dummy address after the read parameter data is stored in the target registers.

DETAILED DESCRIPTION

Figure 1:
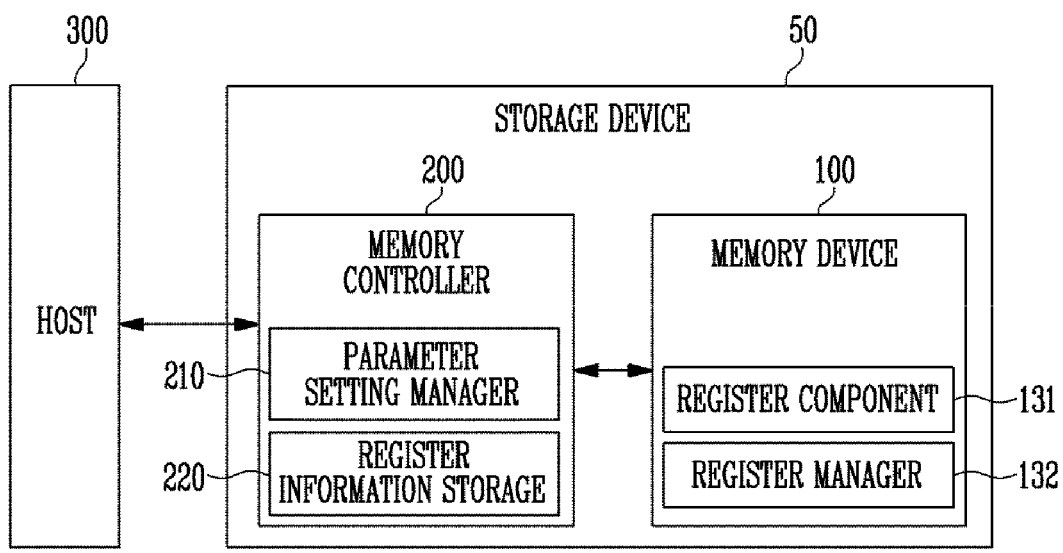
FIG. 1 is a diagram for describing a storage device, according to an embodiment of the present disclosure.

Specific structural or functional descriptions of embodiments based on the concept which are disclosed in the present specification or application are illustrated only to describe the embodiments based on the concept of the present disclosure. The embodiments based on the concept of the present disclosure may be carried out in various forms and the descriptions are not limited to the embodiments described in the present specification or application.

Since various modifications and changes may be applied to the embodiment based on the concept of the present disclosure and the embodiment based on the concept of the present disclosure may have various forms, the specific embodiments will be illustrated in the drawings and described in the present specification or application. However, it should be understood that the embodiment based on the concept of the present disclosure is not construed as limited to a specific disclosure form and includes all changes, equivalents, or substitutes that do not depart from the spirit and technical scope of the present disclosure.

While terms such as "first", "second", and/or the like may be used to describe various components, such components should not be limited to the above-described terms. The above-described terms may be used only to distinguish one component from another component. For example, a first component may be referred to as a second component and similarly, a second component may be referred to as a first component without departing from the scope based on the concept of the present disclosure.

It should be understood that when a component is referred to as being "connected" or "coupled" to another component, the component may be directly connected or coupled to the other element or an intervening component may also be present. In contrast, it should be understood that when a component is referred to as being "directly connected" or "directly coupled" to another component, no intervening component is present. Other expressions describing relationships between components such as "~between," "immediately~between" or "adjacent to~", "directly adjacent to~", and the like should be construed similarly.

The terms used in the present specification are merely used to describe a specific embodiment, and are not intended to limit the present disclosure. Singular expression includes a plural expression, unless the context clearly indicates otherwise. In the present specification, it should be understood that a term "include", "have", or the like indicates that a feature, a number, a step, an operation, a component, a part, or a combination thereof described in the present specification is present, but do not exclude a possibility of presence or addition of one or more other features, numbers, steps, operations, components, parts, or combinations thereof.

So far as not being differently defined, all terms used herein including technical or scientific terminologies have meanings that they are commonly understood by those skilled in the art to which the present disclosure pertains. The terms defined in generally used dictionaries should be construed as having the same meanings as would be construed in the context of the related art, and unless clearly defined otherwise in the present specification, should not be construed as having idealistic or excessively formal meanings.

In describing the embodiment, description of technical contents which are well known in the technical field of the present disclosure and are not directly related to the present disclosure will be omitted. This intends to disclose the gist of the present disclosure more clearly by omitting unnecessary description.

Hereinafter, the present disclosure will be described in detail by describing a preferred embodiment of the present disclosure with reference to the accompanying drawings. Hereinafter, an embodiment of the present disclosure will be described in detail with reference to the accompanying drawings.

An embodiment of the present disclosure provides a storage device having improved reliability and a method of operating the same.

According to the present technology, during a parameter read operation and a parameter change operation of the storage device, the last register is additionally selected in addition to the target register in which the parameter data is stored using the dummy address, and the dummy data is stored in the last register, thereby improving a problem generated due to change of data stored in the last register.

FIG. 1 is a diagram for describing a storage device according to an embodiment of the present disclosure.

Referring to FIG. 1, the storage device 50 may include a memory device 100 and a memory controller 200 that controls an operation of the memory device 100. The storage device 50 is a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of the various types of storage devices based on the host interface, the method of communicating with the host 300. For example, the storage device 50 may be an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, or a memory stick.

The storage device 50 may be manufactured as any one of the various types of packages. For example, the storage device 50 may be manufactured as a package on package (POP), a system in package (SIP), a system on chip (SOC), a multi-chip package (MCP), a chip on board (COB), a wafer-level fabricated package (WFP), or a wafer-level stack package (WSP).

The memory device 100 may store data. The memory device 100 operates in response to the memory controller 200. The memory device 100 may include a memory cell array, including a plurality of memory cells, to store the data. The memory cell array may include a plurality of memory blocks. Each of the memory blocks may include a plurality of memory cells. One memory block may include a plurality of pages. In the embodiment, a page may be a unit for storing data in the memory device 100 or reading data stored in the memory device 100. The memory block may be a unit for erasing data. In the embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, for convenience, it is assumed that the memory device 100 is a NAND flash memory. However, the invention is not limited thereto.

The memory device 100 is configured to receive a command set, the command set including a command and an address, from the memory controller 200. The memory device 100 is configured to access an area, selected by the address, in the memory cell array. That is, the memory device 100 may perform an operation, corresponding to the command, on the area, corresponding to the address. For example, the memory device 100 may perform a write operation (program operation), a read operation, and an erase operation. During the program operation, the memory device 100 may program data to the area based on the address. During the read operation, the memory device 100 may read data from the area based on the address. During the erase operation, the memory device 100 may erase data stored in the area based on the address.

In the embodiment, the memory device 100 may include a register component 131 and a register manager 132.

The register component 131 may include a plurality of registers that store data. The register component 131 may store a plurality of parameter data that indicates the setting information related to the memory device 100. The setting information, related to the memory device 100, may be information required to perform a read, program, or erase operation on the memory device 100. During a power-on operation (a booting operation), the memory device 100 may read a plurality of pieces of parameter data, stored in the memory blocks, in response to a parameter read command, provided by the memory controller 200. The memory device 100 may also store the plurality of pieces of parameter data in the target registers, among the plurality of registers, included in the register component 131. The parameter read command may be a get parameter command set.

The register manager 132 may store dummy data in a dummy register in response to the parameter read command, received from the memory controller 200. In the register component 131, the dummy data may be stored in extra registers that are not designated as target registers. Specifically, after storing the plurality of pieces of parameter data in the target registers, the register manager 132 selects one of the extra registers as the dummy register and stores the dummy data in the selected dummy register. Therefore, the dummy data may be stored in a register in which last data is stored among the plurality of registers included in the register component 131. In addition, the register manager 132 may transmit the register information, included in the register component 131, to the register information storage 220 of the memory controller 200. The register information may be information indicating whether the registers, included in the register component 131, are the target registers storing the parameter data, the dummy registers storing the dummy data, or empty registers in which data is not stored.

The register component 131 may change the selected parameter data, among the plurality of pieces of parameter data stored in the register component 131, in response to a parameter change command provided by the memory controller 200. The parameter change command may be a set parameter command set. In addition, the register component 131 may store dummy data in a register, corresponding to a dummy address, in response to the parameter change command.

The memory controller 200 controls overall operations of the storage device 50.

When power is applied (power on) to the storage device 50, the memory controller 200 may execute firmware FW. When the memory device 100 is a flash memory device, the memory controller 200 may operate firmware, such as a flash translation layer (FTL), to control the communication between the host 300 and the memory device 100.

In the embodiment, the memory controller 200 may receive data and a logical block address (LBA) from the host 300 and convert the logical block address (LBA) into a physical block address (PBA), indicating which memory cells of the memory device 100 the data is to be stored.

The memory controller 200 may control the memory device 100 to perform the program operation, the read operation, or the erase operation in response to a request from the host 300. During the program operation, the memory controller 200 may provide a program command, a physical block address, and data to the memory device 100. During the read operation, the memory controller 200 may provide a read command and the physical block address to the memory device 100. During the erase operation, the memory controller 200 may provide an erase command and the physical block address to the memory device 100.

In the embodiment, the memory controller 200 may generate and transmit a program command, the address, and the data to the memory device 100, regardless of the request from the host 300. For example, the memory controller 200 may provide a command, an address, and data to the memory device 100 so as to perform background operations such as a program operation for wear leveling and a program operation for garbage collection.

In the embodiment, the memory controller 200 may control at least two memory devices 100. In this case, the memory controller 200 may control the memory devices 100 based on an interleaving method to improve operation performance. The interleaving method may be an operation method to overlap operation periods of at least two memory devices 100.

In the embodiment, the memory controller 200 may include a parameter setting manager 210 and a register information storage 220.

The parameter setting manager 210 may generate a get parameter command set during the power on operation of the storage device and output the get parameter command set to the memory device 100. At this time, the get parameter command set may include normal addresses and dummy addresses. The normal address may be an address corresponding to the target registers and the parameter data to be read, while the dummy address may be an address corresponding to the dummy register.

In addition, the parameter setting manager 210 may generate a set parameter command set and output the set parameter command set to the memory device 100 based on a request from the host 300. At this time, the set parameter command set may include normal addresses and dummy addresses. The normal address may be an address corresponding to target registers in which parameter data to be changed are stored, while the dummy address may be an address corresponding to a new dummy register.

In addition, the parameter setting manager 210 generates a get parameter command set or a set parameter command set, including the dummy address, corresponding to the dummy register, based on the information of the registers, provided by the register information storage 220.

The register information storage 220 receives and stores the information of the registers, included in the register component 131 from the memory device 100, and provides the stored information of the registers to the parameter setting manager 210. In addition, the register information storage 220 may receive and store the plurality of pieces of parameter data, stored in the target registers of the register component 131. The register information storage 220 may store the plurality of pieces of parameter data, received from the memory device 100, as setting parameters corresponding to the plurality of pieces of parameter data, respectively. The plurality of setting parameters may indicate the setting information related to the memory device 100. The register information storage 220 may perform an update operation periodically or arbitrarily, receiving the plurality of pieces of parameter data, stored in the memory device 100, and storing the plurality of pieces of parameter data as the setting parameters.

The host 300 may communicate with the storage device 50 using at least one of the various communication methods, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

Figure 2:
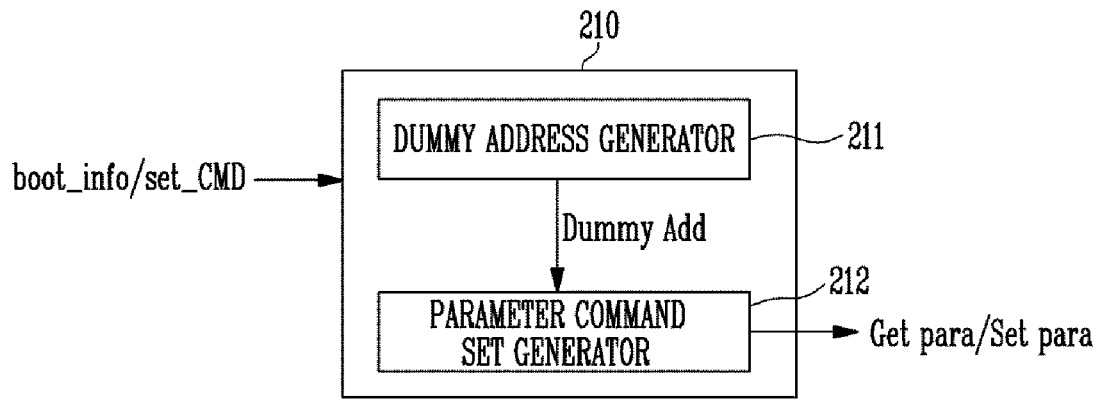
FIG. 2 is a diagram for describing a parameter setting manager of FIG. 1.

FIG. 2 is a diagram for describing the parameter setting manager of FIG. 1.

Referring to FIG. 2, the parameter setting manager 210 generates a get parameter command set (Get para) in response to a booting information signal boot_Info, activated during a power on operation. Furthermore, the parameter setting manager 210 generates a set parameter command set (Set para) when a set command set_CMD, corresponding to a parameter change request, is received from the host 300 of FIG. 1. The set command set_CMD may include new parameter data to be converted.

The parameter setting manager 210 may include a dummy address generator 211 and a parameter command set generator 212.

The dummy address generator 211 receives the register information provided from the register information storage 220 of FIG. 1, selects one of the registers of the register component 131 of FIG. 1 in which data is not stored, based on the received information of the registers, and outputs an address corresponding to the selected register as a dummy address Dummy Add.

The parameter command set generator 212 generates a get parameter command set Get para, including the dummy address Dummy Add, in response to the booting information signal boot_Info. For example, the get parameter command set Get para may include a command, a normal address, and a dummy address Dummy Add, corresponding to a get parameter operation. The normal address is an address corresponding to the target registers and the parameter data to be read.

In addition, the parameter command set generator 212 generates a set parameter command set Set para, including the dummy address Dummy Add, in response to the set command set_CMD. For example, the set parameter command set Get para may include a command, a normal address, new parameter data, a dummy address Dummy Add, and dummy data, corresponding to the set parameter operation. The normal address is an address corresponding to the target register in which the parameter to be changed is stored.

Figure 3:
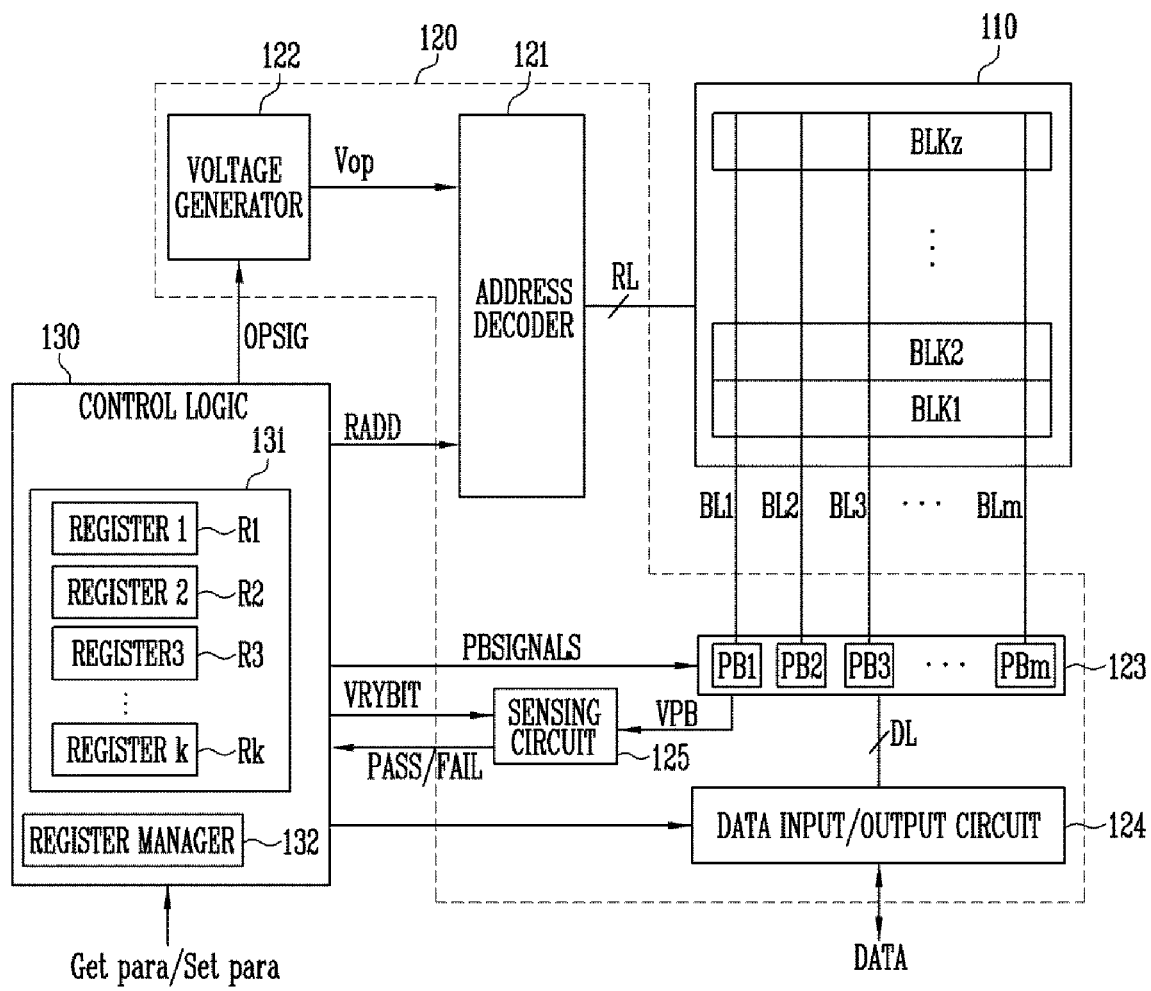
FIG. 3 is diagram for describing a structure of a memory device of FIG. 1.

FIG. 3 is diagram for describing a structure of the memory device of FIG. 1.

Referring to FIG. 3, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read and write circuit 123 through bit lines BL1 to BLm. Each of the plurality of memory blocks BLK1 to BLKz includes a plurality of memory cells. In the embodiment, the plurality of memory cells are non-volatile memory cells. The plurality of memory cells are defined by the memory cells connected to the same word line as one page. That is, the memory cell array 110 is configured of a plurality of pages. According to the embodiment of the present disclosure, each of the plurality of memory blocks BLK1 to BLKz, included in the memory cell array 110, may include a plurality of dummy cells. At least one of the dummy cells may be connected, in series, between a drain select transistor and the memory cells and between a source select transistor and the memory cells.

At least one (for example, BLK1) of the plurality of memory blocks BLK1 to BLKz may be a contents addressable memory (CAM) block, and the CAM block may store a plurality of parameter data as CAM data.

Each of the memory cells of the memory device 100 may be configured as a single level cell (SLC) that stores one data bit, a multi-level cell (MLC) that stores two data bits, a triple level cell (TLC) that stores three data bits, or a quad level cell (QLC) that stores four data bits.

The peripheral circuit 120 may include an address decoder 121, a voltage generator 122, the read and write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

The address decoder 121 is configured to operate in response to control of the control logic 130. The address decoder 121 receives an address ADDR from the control logic 130.

The address decoder 121 is configured to decode a block address of the received address ADDR. The address decoder 121 selects at least one memory block among the memory blocks BLK1 to BLKz based on the decoded block address. The address decoder 121 is configured to decode a row address RADD of the received address ADDR. The address decoder 121 may select at least one word line of the selected memory block by applying voltages to at least one word line based on the decoded row address RADD. The applied voltages may be supplied by the voltage generator 122.

During a program operation, the address decoder 121 may apply a program voltage to a selected word line and apply a pass voltage, having a level less than the program voltage, to unselected word lines. During a program verify operation, the address decoder 121 may apply a verify voltage to the selected word line and apply a verify pass voltage, having a level greater than the verify voltage, to the unselected word lines.

During a read operation, the address decoder 121 may apply a read voltage to the selected word line and apply a read pass voltage, having a level greater than the read voltage, to the unselected word lines.

According to the embodiment of the present disclosure, the erase operation of the memory device 100 is performed on memory blocks as the unit of measurement. The address ADDR, input to the memory device 100 during the erase operation, includes a block address. The address decoder 121 may decode the block address and select one memory block based on the decoded block address. During the erase operation, the address decoder 121 may apply a ground voltage to the word lines that are input to the selected memory block.

According to the embodiment of the present disclosure, the address decoder 121 may be configured to decode a column address of the transferred address ADDR. The decoded column address may be transferred to the read and write circuit 123. For example, the address decoder 121 may include components such as a row decoder, a column decoder, and an address buffer.

The voltage generator 122 is configured to generate a plurality of operation voltages Vop by using an external power voltage supplied to the memory device 100. The voltage generator 122 operates in response to the control of the control logic 130.

As an example, the voltage generator 122 may generate an internal power voltage by regulating the external power voltage. The internal power voltage, generated by the voltage generator 122, is used as an operation voltage for the memory device 100.

In the embodiment, the voltage generator 122 may generate the plurality of operation voltages Vop by using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selection read voltages, and a plurality of non-selection read voltages.

In order to generate the plurality of operation voltages Vop with various voltage levels, the voltage generator 122 may include a plurality of pumping capacitors that receive the internal voltage and selectively activate the plurality of pumping capacitors to generate the plurality of operation voltages Vop.

The plurality of generated operation voltages Vop may be supplied to the memory cell array 110 by the address decoder 121.

The read and write circuit 123 includes first to m-th page buffers PB1 to PBm. The first to m-th page buffers PB1 to PBm are connected to the memory cell array 110 through first to m-th bit lines BL1 to BLm, respectively. The first to m-th page buffers PB1 to PBm operate in response to the control of the control logic 130.

The first to m-th page buffers PB1 to PBm send and receive data DATA with the data input/output circuit 124. When a program operation is initiated, the first to m-th page buffers PB1 to PBm receive the data DATA, to be stored, through the data input/output circuit 124 and data lines DL.

During the program operation, when a program pulse is applied to the selected word line, the first to m-th page buffers PB1 to PBm may transfer the data DATA, to be stored (i.e., the data DATA received through the data input/output circuit 124), to the selected memory cells through the bit lines BL1 to BLm. The memory cells of the selected page are programmed based on the transferred data DATA. A memory cell, connected to a bit line to which a program permission voltage (for example, a ground voltage) is applied, may have an increased threshold voltage. A threshold voltage of a memory cell, connected to a bit line to which a program inhibition voltage (for example, a power voltage) is applied, may be maintained. During the program verify operation, the first to m-th page buffers PB1 to PBm read the data DATA, stored in the memory cells, from the selected memory cells, through the bit lines BL1 to BLm.

During the read operation, the read and write circuit 123 may read the data DATA, from the memory cells of the selected page, through the bit lines BL and store the read data DATA in the first to m-th page buffers PB1 to PBm.

During the erase operation, the read and write circuit 123 may float the bit lines BL. In the embodiment, the read and write circuit 123 may include a column selection circuit.

The data input/output circuit 124 is connected to the first to m-th page buffers PB1 to PBm through the data lines DL. The data input/output circuit 124 operates in response to the control of the control logic 130.

The data input/output circuit 124 may include a plurality of input/output buffers (not shown) that receive input data DATA. During the program operation, the data input/output circuit 124 receives the data DATA, to be stored, from an external controller (not shown). During the read operation, the data input/output circuit 124 outputs the data DATA, transferred from the first to m-th page buffers PB1 to PBm, included in the read and write circuit 123, to the external controller.

During the read operation or the verify operation, the sensing circuit 125 may generate a reference current in response to a signal of a permission bit VRYBIT, generated by the control logic 130, and may compare a sensing voltage VPB, received from the read and write circuit 123, with a reference voltage generated by the reference current to output a pass signal or a fail signal to the control logic 130.

The control logic 130 may be connected to the address decoder 121, the voltage generator 122, the read and write circuit 123, the data input/output circuit 124, and the sensing circuit 125. The control logic 130 may be configured to control all of the operations of the memory device 100. The control logic 130 may operate in response to a command CMD, received from an external device.

The control logic 130 may generate various signals in response to the command CMD and the address ADDR to control the peripheral circuits 120. For example, the control logic 130 may generate an operation signal OPSIG, the row address RADD, a read and write circuit control signal PBSIGNALS, and the permission bit VRYBIT in response to the command CMD and the address ADDR. The control logic 130 may output the operation signal OPSIG to the voltage generator 122, output the row address RADD to the address decoder 121, output the read and write control signal PBSIGNALS to the read and write circuit 123, and output the permission bit VRYBIT to the sensing circuit 125. In addition, the control logic 130 may determine whether the verify operation passed or failed in response to the pass or fail signal PASS/FAIL, output by the sensing circuit 125.

In the embodiment, the control logic 130 may include the register component 131 and the register manager 132.

The register component 131 may include a plurality of registers R1 to Rk. Each of the plurality of registers R1 to Rk may include a latch circuit. Each of the registers, selected as a target register among the plurality of registers R1 to Rk, may store parameter data. For example, during a booting operation, a read operation is performed on the parameter data, included in the CAM block, in response to the get parameter command set Get para, provided by the memory controller 200 described with reference to FIG. 1, and stores the read parameter data in the target registers of the register component 131. The parameter data may correspond to the setting information related to the memory device 100, and the setting information may include at least one of the bad block information, column repair information, and logic information. The bad block information may indicate initial bad memory blocks among a plurality of memory blocks included in the memory device 100. The column repair information may indicate a bad column of the memory cell array 110. The logic information may indicate a program bias, a read bias, an erase bias, and the like, as necessary conditions for the operation of the memory device 100.

In addition, the register component 131 may change and store selected parameter data, among the plurality of pieces of parameter data stored in the register component 131, in response to the set parameter command that is provided by the memory controller 200.

The register manager 132 may store the dummy data in the dummy register in response to a get parameter command Get para, received from the memory controller 200. In the register component 131, the dummy data may be stored in extra registers that are not designated as target registers. Specifically, after storing the plurality of pieces of parameter data in the target registers, the register manager 132 selects one of the extra registers as the dummy register and stores the dummy data in the selected dummy register. In addition, the register manager 132 may transmit the information of the registers, included in the register component 131, to the register information storage 220 of the memory controller 200.

In addition, when the operation of changing the parameter data, stored in the target registers, in response to the set parameter command Set para provided by the memory controller 200, is completed, the register manager 132 selects one of the extra registers, besides the target registers, as the new dummy register and stores the dummy data in the selected dummy register. In addition, the register manager 132 may transmit the parameter data, stored in the target registers of the register component 131, to the register information storage 220 of the memory controller 200.

Figure 4:
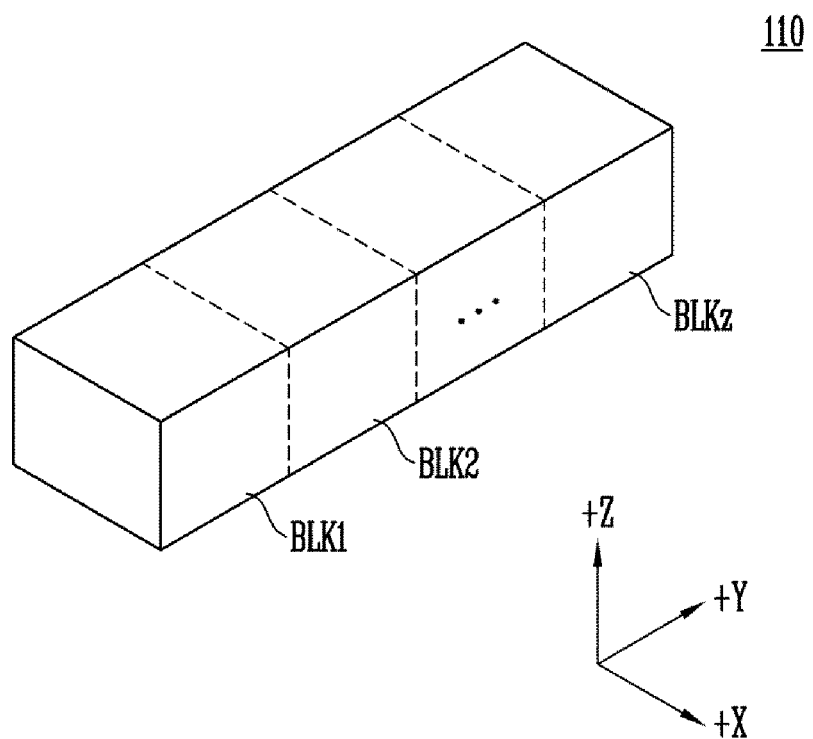
FIG. 4 is a diagram, illustrating an embodiment of a memory cell array of FIG. 3.

FIG. 4 is a diagram, illustrating an embodiment of the memory cell array of FIG. 3.

Referring to FIG. 4, the memory cell array 110 includes a plurality of memory blocks BLK1 to BLKz. Each memory block has a three-dimensional structure. Each memory block includes a plurality of memory cells stacked on a substrate. The plurality of memory cells are arranged along a +X direction, a +Y direction, and a +Z direction. The structure of each memory block is described in more detail with reference to FIG. 5.

Figure 5:
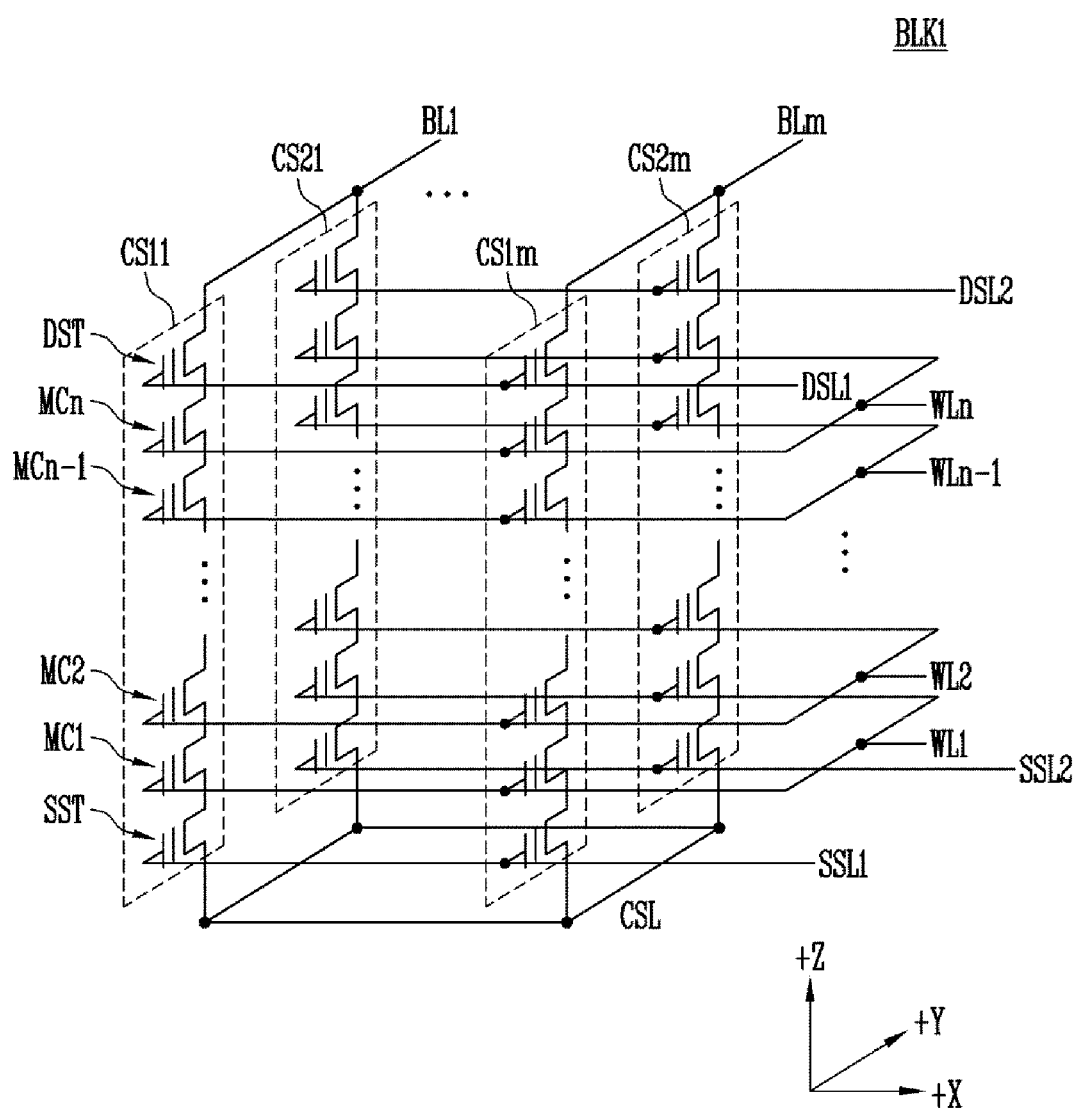
FIG. 5 is a circuit diagram for describing any one memory block of a plurality of memory blocks.

FIG. 5 is a circuit diagram for describing any one memory block of the plurality of memory blocks. In this particular embodiment, the example memory block is labeled BLK1 of the plurality of memory blocks BLK1 to BLKz.

Referring to FIG. 5, the memory block BLK1 includes a plurality of cell strings CS11 to CS1*m* and CS21 to CS2*m*. Each of the plurality of cell strings CS11 to CS1*m* and CS21 to CS2*m* extends in along a +Z direction. Each of the plurality of cell strings CS11 to CS1*m* and CS21 to CS2*m* includes at least one source select transistor SST, first to n-th memory cells MC1 to MCn, and at least one drain select transistor DST, which are stacked on a substrate (not shown) under the memory block BLK1.

The source select transistor SST of each cell string is connected between a common source line CSL and the memory cells MC1 to MCn. The source select transistors of the cell strings arranged in the same row are connected to the same source select line. The source select transistors of the cell strings CS11 to CS1*m*, arranged in a first row, are connected to a first source select line SSL1. The source select transistors of the cell strings CS21 to CS2*m*, arranged in a second row, are connected to a second source select line SSL2. As another embodiment, the source select transistors of the cell strings CS11 to CS1*m* and CS21 to CS2*m* may be commonly connected to one source select line.

The first to n-th memory cells MC1 to MCn of each cell string are connected, in series, between the source select transistor SST and the drain select transistor DST. The gates of the first to n-th memory cells MC1 to MCn are connected to the first to n-th word lines WL1 to WLn, respectively.

The drain select transistor DST of each cell string is connected between a corresponding bit line and the memory cells MC1 to MCn. The drain select transistors of the cell strings, arranged in the row direction, are connected to the drain select line extending in the row direction. The drain select transistors of the cell strings CS11 to CS1*m* of the first row are connected to a first drain select line DSL1. The drain select transistors of the cell strings CS21 to CS2*m* of the second row are connected to a second drain select line DSL2.

In another embodiment, even bit lines and odd bit lines may be provided instead of the first to m-th bit lines BL1 to BL*m*. In addition, even-numbered cell strings among the cell strings CS11 to CS1*m* or CS21 to SC2*m*, arranged in the row direction, may be connected to the bit lines. On the other hand, the odd-numbered cell strings among the cell strings CS11 to CS1*m* or CS21 to CS2*m*, arranged in the row direction, may be connected to odd bit lines, respectively.

In the embodiment, at least one of the first to n-th memory cells MC1 to MCn may be used as a dummy memory cell. For example, at least one dummy memory cell may be provided to reduce an electric field between the source select transistor SST and the memory cells MC1 to MCn. Alternatively, at least one dummy memory cell may be provided to reduce an electric field between the drain select transistor DST and the memory cells MC1 to MCn. As more dummy memory cells are provided, reliability of an operation for the memory block BLK1 improves. However, the size of the memory block BLK1 increases with more dummy memory cells. As less memory cells are provided, the size of the memory block BLK1 may be reduced, but in turn, the reliability of the operation for the memory block BLK1 may also be reduced.

In order to efficiently control at least one dummy memory cell, each of the dummy memory cells may have a required threshold voltage. Before or after an erase operation on the memory block BLK1, program operations for all or a part of the dummy memory cells may be performed. When the erase operation is performed after the program operation is performed, the dummy memory cells may have the required threshold voltage by controlling a voltage applied to dummy word lines that is connected to the respective dummy memory cells.

Figure 6:
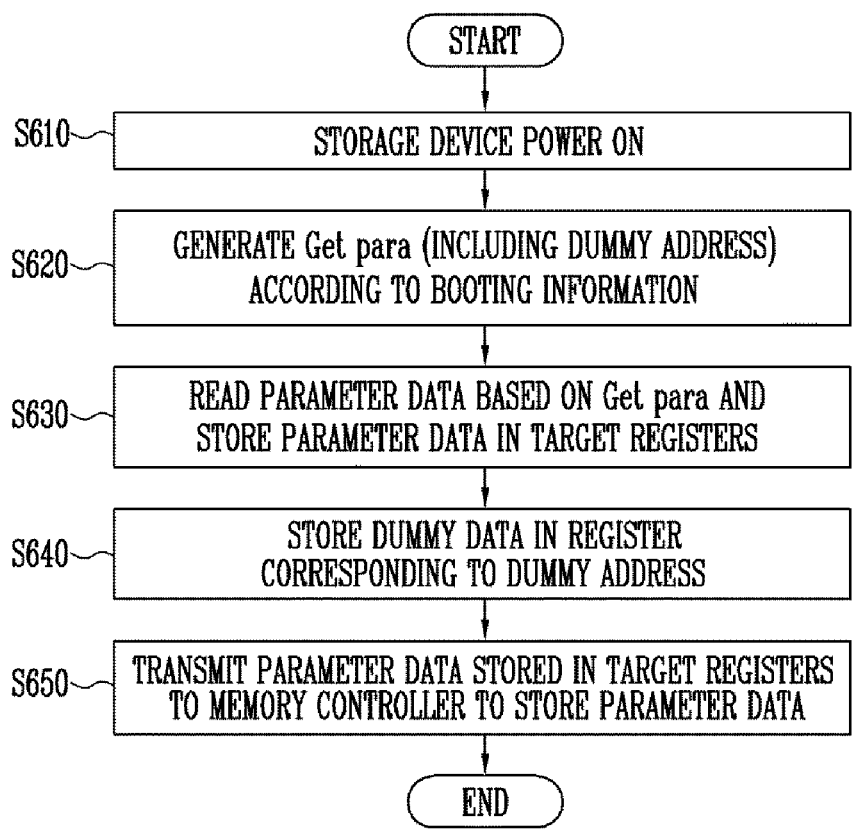
FIG. 6 is a flowchart for describing a parameter read operation of the storage device according to an embodiment of the present disclosure.

FIG. 6 is a flowchart for describing a parameter read operation of the storage device according to an embodiment of the present disclosure.

Figure 7:
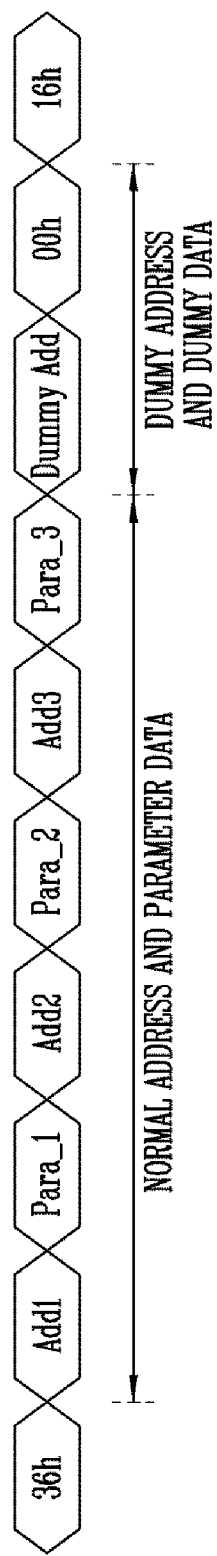
FIG. 7 is a diagram for describing a command and data transmission operation, during the parameter read operation, according to an embodiment of the present disclosure.

FIG. 7 is a diagram for describing a command and data transmission operation, during the parameter read operation, according to an embodiment of the present disclosure.

Figure 8:
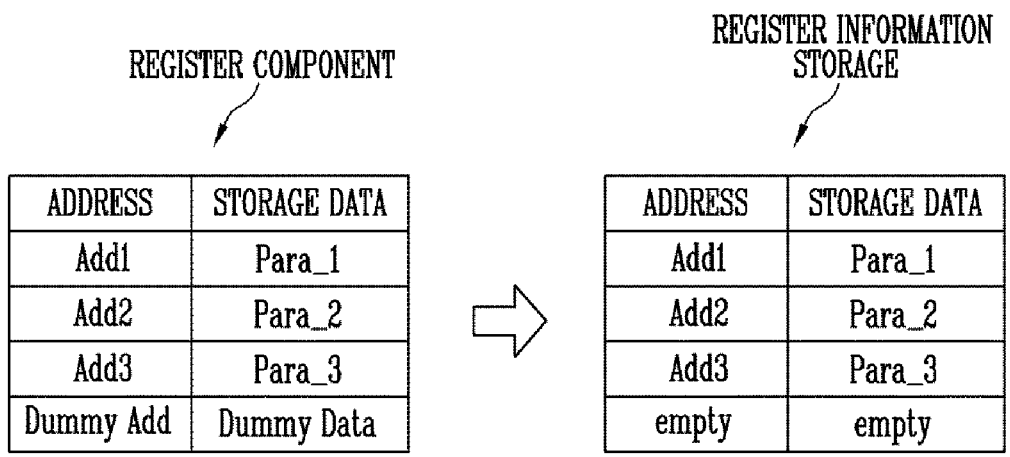
FIG. 8 is a diagram for describing data stored in a register component and a register information storage, during the parameter read operation, according to an embodiment of the present disclosure.

FIG. 8 is a diagram for describing data stored in the register component and the register information storage, during the parameter read operation, according to an embodiment of the present disclosure.

The parameter read operation of the storage device is described with reference to FIGS. 1 to 8 as follows.

When a power voltage is supplied to the storage device 50 and powered on (S610), the parameter setting manager 210 of the memory controller 200 generates the get parameter command set Get para in response to the booting information boot_info and outputs the generated get parameter command set Get para to the memory device 100 (S620). At this point in time, the get parameter command set may include a parameter read command 36*h*, normal addresses (for example, Add1 to Add3), a dummy address Dummy Add, and an end command 16*h* corresponding to the parameter read operation. The normal address (for example, Add1 to Add3) may be an address corresponding to the parameter data Para_1 to Para_3 to be read and the target registers (for example, R1 to R3), and the dummy address Dummy Add may be an address corresponding to the dummy register (for example, Rk).

The memory device 100 performs the parameter read operation in response to the get parameter command set Get para. For example, the control logic 130 controls the peripheral circuit 120 to read a plurality of pieces of parameter data (for example, Para_1, Para_2, and Para_3) stored in the CAM block (for example, BLK1) in response to the parameter read command 37*h* included in the get parameter command set Get para. The peripheral circuit 120 reads the plurality of pieces of parameter data (for example, Para_1, Para_2, and Para_3), stored in the CAM block (for example, BLK1), and stores each of the read plurality of pieces of parameter data Para_1, Para_2, and Para_3 in target registers (for example, R1, R2, and R3), corresponding to the normal addresses Add1, Add2, and Add3 included in the get parameter command set Get para (S630).

When the storage operation of each of the plurality of pieces of parameter data (for example, Para_1, Para_2, and Para_3) in the target registers (for example, R1, R2, and R3) is completed, the register manager 132 selects the register Rk, corresponding to the dummy address Dummy Add among the plurality of registers R1 to Rk, and stores dummy data 00*h* (Dummy Data) in the selected dummy register (S640). Therefore, the register in which data is last stored is the dummy register Rk, corresponding to the dummy address Dummy Add, the dummy data Dummy data that has no effect on the operation of the memory device 100 and is meaningless, which is stored in the dummy register Rk. Thus, even though an error occurs in the operation of last storing data in the register during the parameter read operation, reliability of the parameter data Para_1, Para_2, and Para_3, stored in the target registers R1 to R3, is guaranteed.

In addition, the register manager 132 may transmit the information of the registers, included in the register component 131, to the register information storage 220 of the memory controller 200. In addition, the register manager 132 may transmit the parameter data, stored in the target registers R1 to R3 of the register component 131, to the register information storage 220 of the memory controller 200 (S650).

Figure 9:
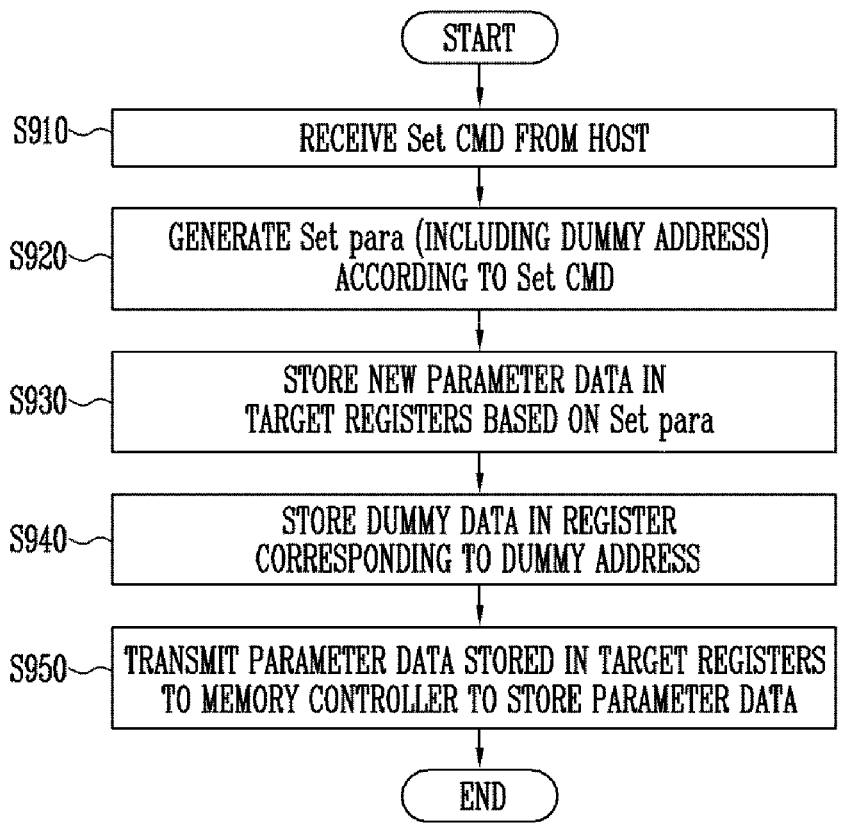
FIG. 9 is a flowchart for describing a parameter change operation of the storage device, according to an embodiment of the present disclosure.

FIG. 9 is a flowchart for describing a parameter change operation of the storage device according to an embodiment of the present disclosure.

Figure 10:
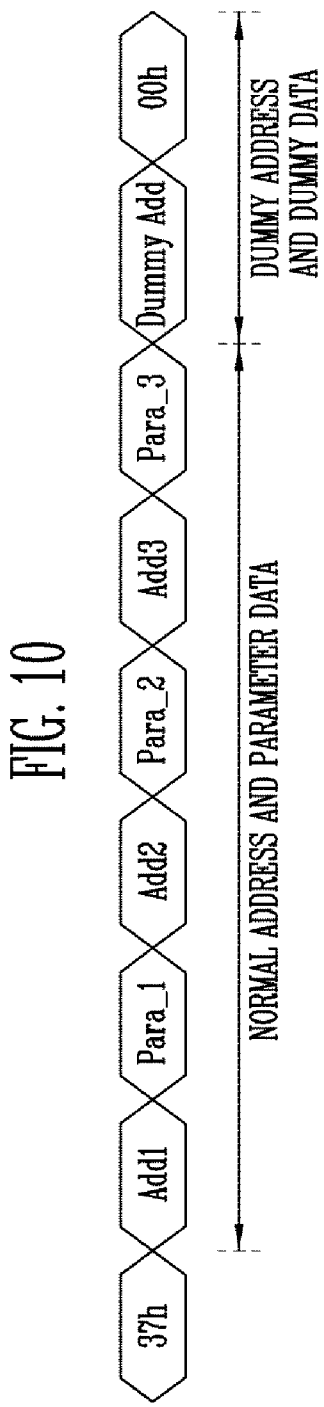
FIG. 10 is a diagram for describing a command and data transmission operation, during the parameter change operation, according to an embodiment of the present disclosure.

FIG. 10 is a diagram for describing a command and data transmission operation during the parameter change operation according to an embodiment of the present disclosure.

Figures 11, 12:
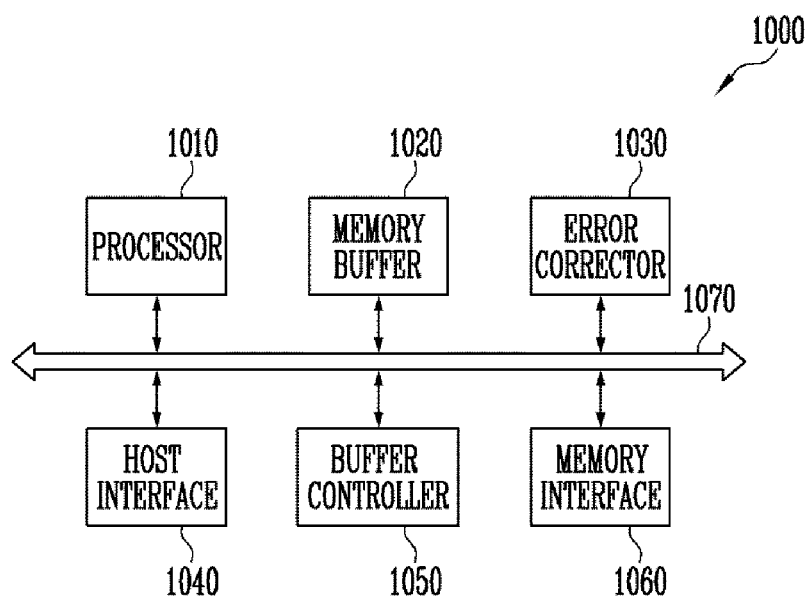
FIG. 11 is a diagram for describing data, stored in a register component, during the parameter change operation, according to an embodiment of the present disclosure.
FIG. 12 is a diagram for describing another embodiment of the memory controller of FIG. 1.

FIG. 11 is a diagram for describing data stored in the register component during the parameter change operation according to an embodiment of the present disclosure.

The parameter change operation of the storage device is described with reference to FIGS. 1 to 5 and 9 to 11 as follows.

When the set command set_CMD, corresponding to the parameter change request, is received from the host 300 (S910), the parameter setting manager 210 of the memory controller 200 generates the set parameter command Set para in response to the set command set_Set and outputs the generated set parameter command set Set para to the memory device 100 (S920). At this time, the dummy address generator 211 receives the information of the registers provided from the register information storage 220, selects any one (for example, Rk) of the registers in which data is not stored among the registers R1 to Rk, included in the register component 131 of the memory device 100, based on the received information of the registers, and outputs an address corresponding to the selected register Rk as the dummy address Dummy Add. In response to the set command set_CMD, the parameter command set generator may include the set parameter command 37*h*, the normal address (for example, Add1 to Add3), the new parameter data Para1 to Para3, the dummy address Dummy Add, and the dummy data 00*h*, corresponding to the set parameter operation. The normal address is an address corresponding to a target register (for example, R1 to R3) in which a parameter to be changed is stored.

The memory device 100 performs the parameter change operation in response to the set parameter command set Set para. For example, the register component 131 stores the new parameter data Rara_1 to Para_3 in the target registers R1 to R3, corresponding to the normal addresses Add1 to Add3, among the plurality of registers R1 to Rk, in response to the set parameter command set Set para (S930).

When the storage operation of the new parameter data Rara_1 to Para_3 in the target registers R1 to R3 corresponding to the normal addresses Add1 to Add3 is completed, the register component 131 stores the dummy data Dummy Data in the dummy register (for example, Rk) corresponding to the dummy address Dummy Add (S940). Therefore, the register in which last data is stored among the plurality of registers R1 to Rk included in the register component 131 is the dummy register Rk corresponding to the dummy address Dummy Add, and the dummy data Dummy Data that is regardless of the operation of the memory device 100 and is meaningless is stored in the dummy register Rk. Therefore, even though an error occurs in an operation of last storing data in the register during the parameter change operation, reliability of the parameter data Para_1, Para_2, and Para_3 stored in the target registers R1 to R3 is guaranteed.

In addition, the register manager 132 may transmit the information of the registers included in the register component 131 to the register information storage 220 of the memory controller 200. In addition, the register manager 132 may transmit the parameter data stored in the target registers R1 to R3 of the register component 131 to the register information storage 220 of the memory controller 200 (S950).

FIG. 12 is a diagram for describing another embodiment of the memory controller of FIG. 1.

Referring to FIG. 12, the memory controller 1000 is connected to the host Host and the memory device. The memory controller 1000 is configured to access the memory device in response to the request from the host Host. For example, the memory controller 1000 is configured to control write, read, erase, and background operations of the memory device. The memory controller 1000 is configured to provide an interface between the memory device and the host Host. The memory controller 1000 is configured to drive firmware to control the memory device.

The memory controller 1000 may include a processor 1010, a memory buffer 1020, an error corrector (ECC) 1030, a host interface 1040, a buffer control circuit 1050, a memory interface 1060, and a bus 1070.

The bus 1070 may be configured to provide a channel between components of the memory controller 1000.

The processor 1010 may control overall operations of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of a flash translation layer (FTL). The processor 1010 may convert a logical block address (LBA) provided by the host into a physical block address (PBA) through the flash translation layer (FTL). The flash translation layer (FTL) may receive the logical block address (LBA) using a mapping table and may convert the logical block address (LBA) into the physical block address (PBA). There are various address mapping methods of the flash translation layer, based on a mapping unit. Representative address mapping methods include a page mapping method, a block mapping method, and a hybrid mapping method.

The processor 1010 is configured to randomize data received from the host Host. For example, the processor 1010 may randomize the data received from the host Host using a randomizing seed. The randomized data is provided to the memory device as data to be stored and is programmed to the memory cell array.

The processor 1010 is configured to de-randomize data received from the memory device during the read operation. For example, the processor 1010 may de-randomize the data received from the memory device using a de-randomizing seed. The de-randomized data may be output to the host Host.

In the embodiment, the processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error corrector 1030 may perform error correction. The error corrector 1030 may perform error correction encoding (ECC encoding) based on data to be written to the memory device through memory interface 1060. The error correction encoded data may be transferred to the memory device through the memory interface 1060. The error corrector 1030 may perform error correction decoding (ECC decoding) on the data received from the memory device through the memory interface 1060. As an example, the error corrector 1030 may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

As an example, the memory controller 1000 might not include the memory buffer 1020 and the buffer controller 1050.

As an example, the processor 1010 may control the operation of the memory controller 1000 using codes. The processor 1010 may load the codes from a non-volatile memory device (for example, a read only memory) provided inside the memory controller 1000. As another example, the processor 1010 may load the codes from the memory device through the memory interface 1060.

As an example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and might not interfere with each other or affect each other. The data bus may be connected to the host interface 1040, the buffer controller 1050, the error corrector 1030, and the memory interface 1060. The control bus may be connected to the host interface 1040, the processor 1010, the buffer controller 1050, the memory buffer 1202, and the memory interface 1060.

Figure 13:
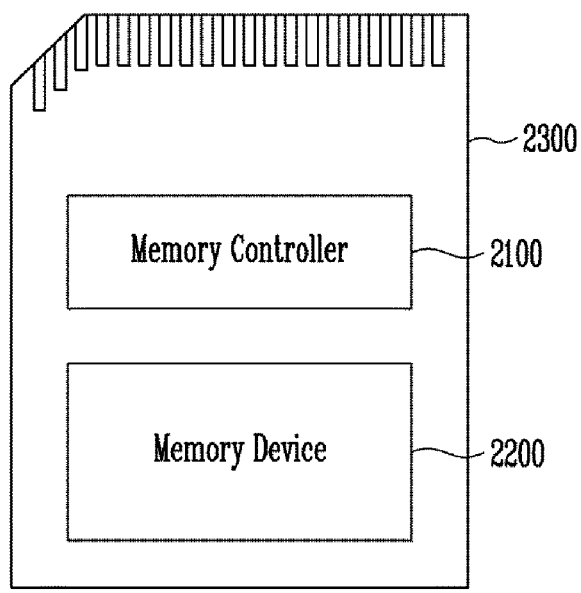
FIG. 13 is a block diagram, illustrating a memory card system to which a storage device, according to an embodiment of the present disclosure is applied.

FIG. 13 is a block diagram illustrating a memory card system to which a storage device according to an embodiment of the present disclosure is applied.

Referring to FIG. 13, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control read, write, erase, and background operations of the memory device 2200. The memory controller 2100 is configured to provide an interface between the memory device 2200 and the host Host. The memory controller 2100 is configured to drive firmware to control the memory device 2200. The memory controller 2100 may be implemented equally to the memory controller 200 described with reference to FIG. 1.

As an example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) based on a specific communication standard. As an example, the memory controller 2100 is configured to communicate with an external device through at least one of various communication standards such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe. As an example, the connector 2300 may be defined by at least one of the various communication standards described above.

As an example, the memory device 2200 may be configured as various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 14:
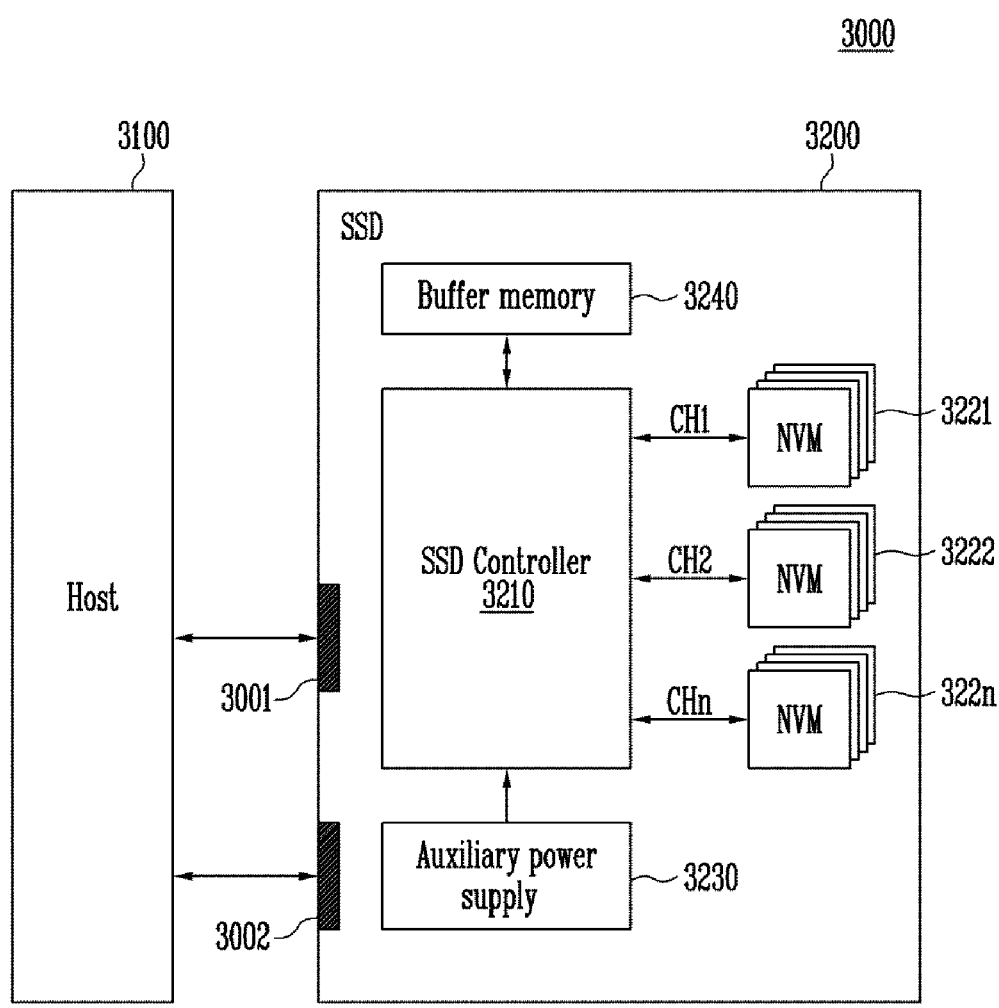
FIG. 14 is a block diagram, illustrating a solid state drive (SSD) system to which a storage device, according to an embodiment of the present disclosure is applied.

FIG. 14 is a block diagram illustrating a solid state drive (SSD) system to which a storage device according to an embodiment of the present disclosure is applied.

Referring to FIG. 14, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

According to the embodiment of the present disclosure, the SSD controller 3210 may perform the function of the memory controller 200 described with reference to FIG. 1.

The SSD controller 3210 may control the plurality of flash memories 3221 to 322n in response to the signal SIG received from the host 3100. As an example, the signal SIG may be signals based on an interface between the host 3100 and the SSD 3200. For example, the signal SIG may be a signal defined by at least one of interfaces such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. As an example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 15:
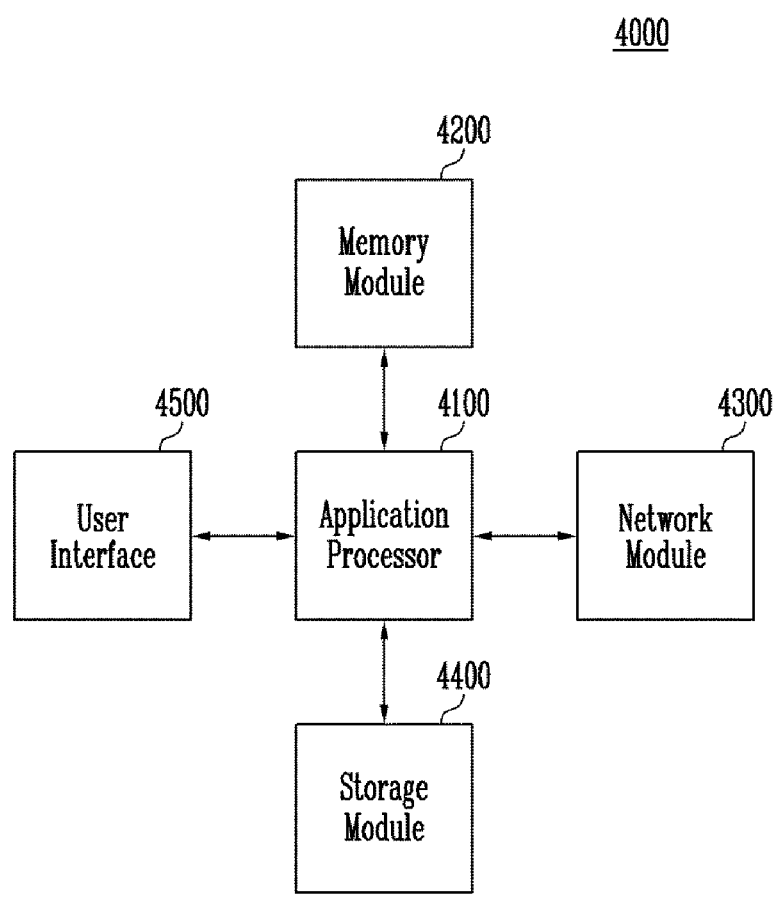
FIG. 15 is a block diagram, illustrating a user system to which a storage device, according to an embodiment of the present disclosure is applied.

FIG. 15 is a block diagram illustrating a user system to which a storage device according to an embodiment of the present disclosure is applied.

Referring to FIG. 15, the user system 4000 includes an application processor 4100, a memory module 4200, a network module 4300, a storage module 4400, and a user interface 4500.

The application processor 4100 may drive components, an operating system (OS), a user program, or the like included in the user system 4000. As an example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. As an example, the application processor 4100 and memory module 4200 may be packaged based on a package on package (POP) and provided as one semiconductor package.

The network module 4300 may communicate with external devices. As an example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. As an example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. As an example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. As an example, the storage module 4400 may be provided as a removable storage device (removable drive), such as a memory card, and an external drive of the user system 4000.

As an example, the storage module 4400 may include a plurality of non-volatile memory devices, and the plurality of non-volatile memory devices may operate equally to the memory device 100 described with reference to FIG. 1. The storage module 4400 may operate equally to the storage device 50 described with reference to FIG. 1.

The user interface 4500 may include interfaces for inputting data or an instruction to the application processor 4100 or for outputting data to an external device. As an example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a motor.

Although the detailed description of the present disclosure describes specific embodiments, various changes and modifications may be made without departing from the scope and technical spirit of the present disclosure. Therefore, the scope of the present disclosure should not be limited to the above-described embodiments, and should be determined by the equivalents of the claims of the present disclosure as well as the following claims.

Although the present disclosure has been described with reference to the limited embodiments and drawings, the present disclosure is not limited to the embodiments described above, and various changes and modifications may be made from the disclosed description by those skilled in the art to which the present disclosure pertains.

Therefore, the scope of the present disclosure should not be limited to the described embodiments, and should be determined by the equivalents of the claims as well as the following claims.

In the embodiments described above, all of the steps may optionally be performed or omitted. In addition, the steps in each embodiment need not occur in order, and may be reversed. Meanwhile, the embodiments of the present disclosure disclosed in the present specification and the drawings are merely specific examples for easily describing the technical content of the present specification and facilitating understanding of the present specification and do not limit the scope of the present specification. That is, it is apparent to those skilled in the art to which the present disclosure pertains that other modification examples based on the technical spirit of the present disclosure are possible.

Meanwhile, the present specification and drawings disclose a preferred embodiment of the present disclosure. Although specific terms are used, they are used in general meaning for purposes of easily describing technical content of the present disclosure and facilitating understanding of the present disclosure, and are not intended to limit the scope of the present disclosure. It is apparent to those skilled in the art to which the present disclosure pertains that other modification examples based on the technical spirit of the present disclosure may be carried out in addition to the embodiments disclosed herein.

What is claimed is:

1. A storage device comprising:
a memory controller configured to generate and output a get parameter command set, including normal addresses and a dummy address, during a read parameter operation; and
a memory device configured to, read a parameter data stored in a CAM block, and which is additionally configured to store the read parameter data in target registers corresponding to the normal addresses, responsive to the get parameter command set;
wherein the memory device stores dummy data in a dummy register corresponding to the dummy address.

2. The storage device of claim 1, wherein the memory device stores the read parameter data in the target registers, and then stores the dummy data in the dummy register.

3. The storage device of claim 1, wherein the memory controller generates the get parameter command set during a power-on operation.

4. The storage device of claim 1, wherein the memory controller comprises:

a parameter setting manager configured to generate the get parameter command set during a power-on operation; and
a register information storage configured to receive register information and the parameter data or the read parameter data, stored in the target registers, from the memory device, and to store the register information and the parameter data or the read parameter data.

5. The storage device of claim 4, wherein the parameter setting manager comprises:
a dummy address generator configured to receive the register information from the register information storage and generate the dummy address based on the received register information; and
a parameter command set generator configured to generate the get parameter command set including the dummy address generated by the dummy address generator based on boot information during the power on operation.

6. The storage device of claim 1, wherein the memory device comprises:
a CAM block configured to store the parameter data;
a peripheral circuit configured to read the parameter data, stored in the CAM block; and
a control logic configured to control the peripheral circuit to read the parameter data in response to the get parameter command set, store the read parameter data, and transmit the stored parameter data to the memory controller.

7. The storage device of claim 6, wherein the control logic comprises:
a register component including the target registers and the dummy register; and
a register manager configured to store the dummy data in the dummy register in response to the get parameter command set after the read parameter data is stored in the target registers.

8. The storage device of claim 1, wherein the read parameter data corresponds to setting information related to the memory device, and the setting information includes at least one of bad block information, column repair information, and logic information.

9. A storage device comprising:
a memory controller configured to generate and output a set parameter command set, including normal addresses and a dummy address, during a parameter conversion operation; and
a memory device configured to, in response to the set parameter command set, store new parameter data in a plurality of target registers corresponding to the normal addresses, in which previous parameter data are stored,
wherein the memory device stores dummy data in a dummy register corresponding to the dummy address.

10. The storage device of claim 9, wherein the memory device stores the new parameter data in the target registers, and then stores the dummy data in the dummy register.

11. The storage device of claim 9, wherein the memory controller generates the set parameter command set when a parameter data conversion request is received from an outside.

12. The storage device of claim 9, wherein the memory controller comprises:
a parameter setting manager configured to generate the set parameter command set when a set command is received from an outside source; and
a register information storage configured to receive register information and the previous parameter data or the new parameter data, stored in the target registers, from the memory device to store the register information and the previous parameter data or the new parameter data.

13. The storage device of claim 12, wherein the parameter setting manager comprises:
   a dummy address generator configured to receive the register information from the register information storage and generate the dummy address based on the received register information; and
   a parameter command set generator configured to generate the set parameter command set including the dummy address generated by the dummy address generator based on the set command.

14. The storage device of claim 9, further comprising:
   a register component including the target registers and the dummy register; and
   a register manager configured to store the dummy data in the dummy register in response to the set parameter command set after the new parameter data is stored in the target registers.

15. A method of operating a storage device, the method comprising:
   storing a read parameter data within a CAM block of a memory device within the storage device;
   generating and transmitting a get parameter command set, including a normal address and a dummy address, to the memory device;
   reading the read parameter data, stored in the CAM block, in response to the get parameter command set, and storing the read parameter data in target registers, among a plurality of registers, corresponding to the normal address; and
   storing dummy data in a dummy register, among the plurality of registers, corresponding to the dummy address, after the read parameter data is stored in the target registers.

16. The method of claim 15, further comprising:
   transmitting the read parameter data, stored in the target registers, to a memory controller to store the read parameter data, after the dummy data is stored in the dummy register,
   wherein the memory controller controls the memory device.

17. The method of claim 15, wherein the read parameter data corresponds to setting information related to the memory device, and the setting information includes at least one of bad block information, column repair information, and logic information.

18. The method of claim 15, further comprising:
   generating a set parameter command set including the normal address, new parameter data, and the dummy address and transmitting the set parameter command set to the memory device when a conversion request of the read parameter data is received from an outside;
   storing the new parameter data in the target registers corresponding to the normal addresses in response to the set parameter command set; and
   storing new dummy data in the dummy register corresponding to the dummy address.

19. The method of claim 18, wherein the storing of the new dummy data in the dummy register is performed after the new parameter data is completely stored in the target registers.

* * * * *